(12) United States Patent
Ku et al.

(10) Patent No.: US 7,988,216 B2
(45) Date of Patent: Aug. 2, 2011

(54) HOLDING APPARATUS

(75) Inventors: You-En Ku, Taoyuan County (TW);
Huang-Ken Tai, Taoyuan County (TW)

(73) Assignee: Inotera Memories, Inc., Taoyuan (TW)

( * ) Notice: Subject to any disclaimer, the term of this patent is extended or adjusted under 35 U.S.C. 154(b) by 583 days.

(21) Appl. No.: 12/052,432

(22) Filed: Mar. 20, 2008

(65) Prior Publication Data
US 2009/0196718 A1 Aug. 6, 2009

(30) Foreign Application Priority Data
Feb. 5, 2008 (TW) .............................. 97104539 A

(51) Int. Cl.
*B65G 49/07* (2006.01)
(52) U.S. Cl. .................... 294/103.1; 294/88; 414/941
(58) Field of Classification Search .............. 294/88, 294/103.1, 1.1; 414/935, 941; 269/25, 30
See application file for complete search history.

(56) References Cited

U.S. PATENT DOCUMENTS

| 3,727,772 | A | * | 4/1973 | Pauls ........................ 414/746.8 |
| 4,238,169 | A | * | 12/1980 | DePriester et al. ........... 414/783 |
| 4,907,834 | A | * | 3/1990 | Dejong et al. ................. 294/88 |
| 5,335,955 | A | * | 8/1994 | Pekka et al. .................... 294/88 |
| 6,256,555 | B1 | * | 7/2001 | Bacchi et al. ................. 700/245 |
| 6,454,332 | B1 | * | 9/2002 | Govzman et al. ............ 294/64.1 |
| 6,913,302 | B2 | * | 7/2005 | Yokota et al. ............... 294/103.1 |
| 7,290,813 | B2 | * | 11/2007 | Bonora et al. .................. 294/1.1 |
| 7,334,826 | B2 | * | 2/2008 | Woodruff et al. .......... 294/103.1 |
| 2002/0071756 | A1 | * | 6/2002 | Gonzalez ...................... 414/941 |
| 2006/0192400 | A1 | * | 8/2006 | Kim et al. .................. 294/103.1 |
| 2007/0216179 | A1 | * | 9/2007 | Hirooka et al. ............ 294/103.1 |

FOREIGN PATENT DOCUMENTS
TW 200739794 A 10/2007
* cited by examiner

*Primary Examiner* — Dean J Kramer

(57) ABSTRACT

A holding apparatus for holding a semiconductor wafer comprises a pneumatic cylinder, a plunger movably connected to the pneumatic cylinder, an inlet pipe connected to the pneumatic cylinder, and a relief valve connected to the inlet pipe. Clean dry air is pumped into the pneumatic cylinder through the inlet pipe to impel the plunger in a first direction to contact the wafer. A part of the air in the inlet pipe is discharged through the relief valve to regulate air pressure to the pneumatic cylinder.

15 Claims, 3 Drawing Sheets

HOLDING APPARATUS

BACKGROUND OF THE INVENTION

1. Field of the Invention

The invention relates in general to a holding apparatus and in particular to a holding apparatus for holding a semiconductor wafer.

2. Description of the Related Art

In semiconductor fabrication, robotic manipulators are generally used for handling semiconductor wafers. However, wafer buckling and particle contamination may occur when the robotic manipulator contacts the wafer with excessive driving force, thus decreasing production yield.

BRIEF SUMMARY OF INVENTION

The invention provides a holding apparatus for holding a semiconductor wafer. An embodiment of the holding apparatus comprises a pneumatic cylinder, a plunger movably connected to the pneumatic cylinder, an inlet pipe connected to the pneumatic cylinder, and a relief valve connected to the inlet pipe. Clean dry air is pumped into the pneumatic cylinder through the inlet pipe to impel the plunger in a first direction to contact the wafer. A portion of the air in the inlet pipe is discharged through the relief valve to regulate air pressure to the pneumatic cylinder.

The invention further provides a robotic manipulator for handling a semiconductor wafer. An embodiment of the robotic manipulator comprises a base, a first arm movable with respect to the base, a pneumatic cylinder disposed in the first arm, a plunger movably connected to the pneumatic cylinder, an inlet pipe connected to the pneumatic cylinder, and a relief valve connected to the inlet pipe. Clean dry air is pumped into the pneumatic cylinder through the inlet pipe to impel the plunger in a first direction to contact the wafer. A portion of the air in the inlet pipe is discharged through the relief valve to regulate air pressure to the pneumatic cylinder.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
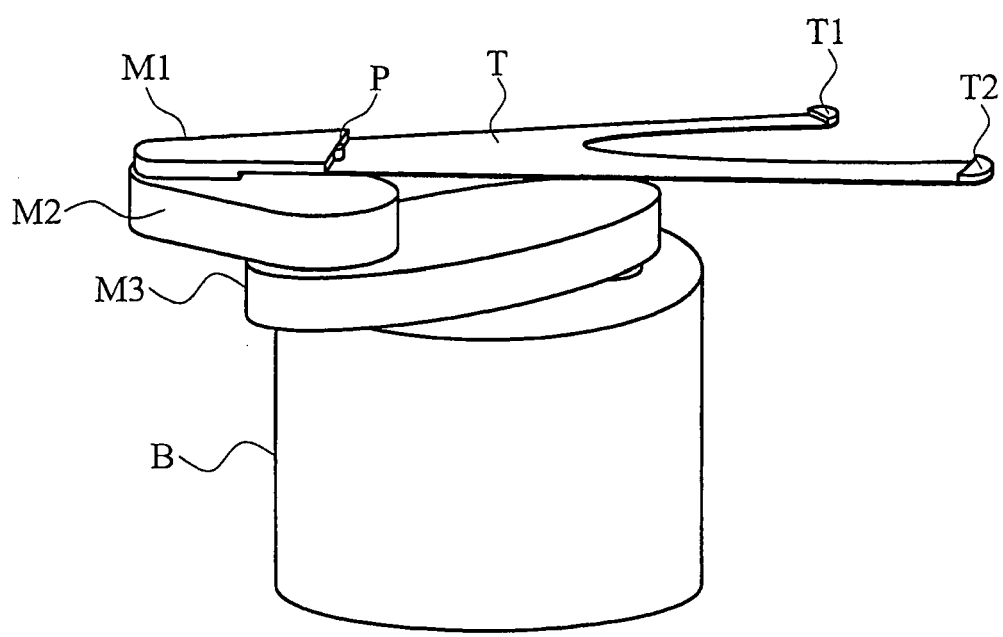
FIGS. 1 and 2 are perspective diagrams of an embodiment of a holding apparatus.
Figure 2:
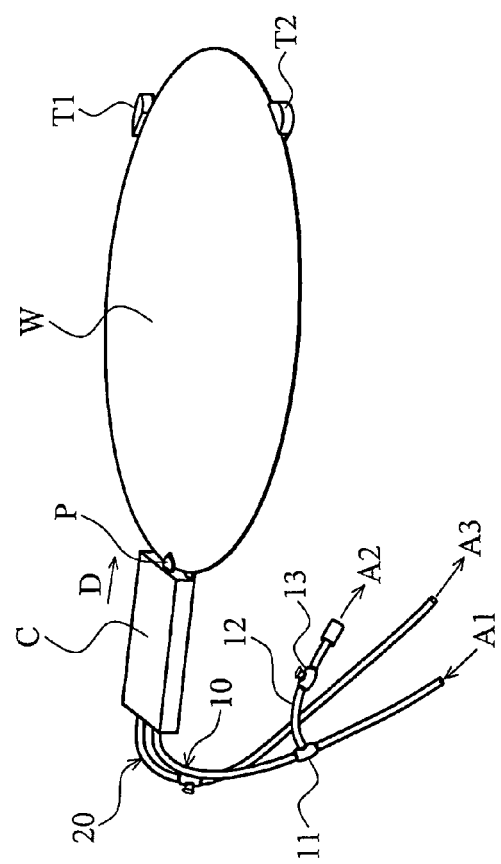

Referring to FIG. 1, an embodiment of a holding apparatus, such as a robotic manipulator, is used for handling a semiconductor wafer W (shown in FIG. 2). The holding apparatus primarily comprises a base B, a first arm M1, a second arm M2, a third arm M3, a plunger P, and a tray T. In FIG. 1, the third arm M3 rotatably connects to the base B, and the second arm M2 rotatably connects the first third arms M1 and M3. The tray T is fixed to the first arm M1 for sustaining the semiconductor wafer W. The plunger P is disposed on a side of the first arm M1, and the tray T comprises two protruding stop portions T1 and T2 at the edge thereof. The semiconductor wafer W can be held and fixed in a predetermined position on the tray T by the plunger P and the stop portions T1 and T2.

FIG. 2 depicts a detailed structure inside the holding apparatus, wherein the base B and the arms M1~M3 in FIG. 1 are omitted therefrom. A pneumatic cylinder C shown in FIG. 2 is disposed in the first arm M1 and movably connected to the plunger P. Furthermore, an inlet pipe 10 and an exhaust pipe 20 are connected to the pneumatic cylinder C. When holding the wafer W, clean dry air (CDA) is pumped into the pneumatic cylinder C through the inlet pipe 10, as the arrow A1 shows in FIG. 2, thus impelling the plunger P in a first direction D to contact the wafer W.

In this embodiment, a discharge pipe 12 is connected to the inlet pipe 10 through a three-way joint 11, wherein an adjustable relief valve 13 is disposed on the discharge pipe 12. Hence, a portion of the air in the inlet pipe 10 can be discharged through the discharge pipe 12 by adjusting the relief valve 13 (as the arrow A2 shows in FIG. 2), to regulate air pressure to the pneumatic cylinder C. Since the relief valve 13 is adjustable and capable of regulating air flow into the pneumatic cylinder C, driving force from the pneumatic cylinder C and moving velocity of the plunger P can be appropriately controlled, thus preventing the wafer W from buckling and impact damages. When releasing the wafer W, air is discharged from the pneumatic cylinder C through the exhaust pipe 20 (as the arrow A3 shows in FIG. 3), such that the plunger P is separated from the wafer W.

Figure 3:
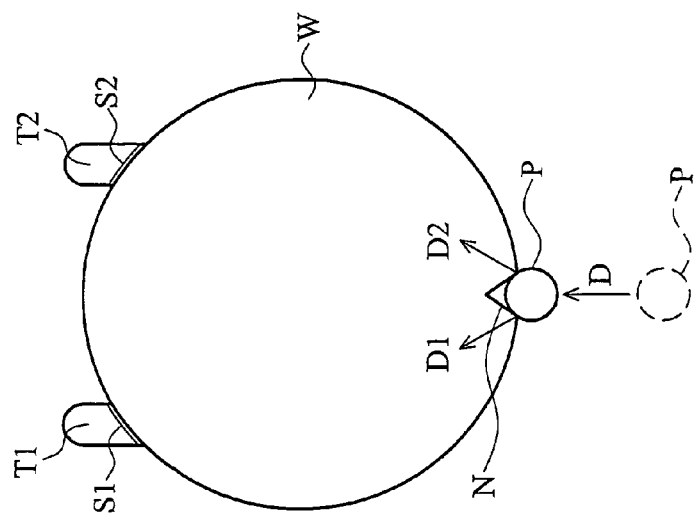
FIG. 3 is a perspective diagram of a plunger and two stop portions contacting the semiconductor wafer.

Referring to FIG. 3, when the wafer W is disposed on the tray T, the pneumatic cylinder C is driven by clean dry air to impel the plunger P from an initial position (as the dashed line indicates in FIG. 3) along the first direction D to contact a notch N of the wafer W. Here, the plunger P pushes the wafer W against two curved flanges S1 and S2 of the two stop portions T1 and T2, thus restricting the wafer W in a predetermined position. In this embodiment, the plunger P has a curved surface abutting opposite sides of the notch N and distributes an unidirectional force into two component impact forces along different directions D1 and D2. With the impact force decentralized and the impact area increased, buckling and damage of the wafer W are efficiently prevented.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A holding apparatus for holding a semiconductor wafer, wherein the semiconductor wafer has a notch, the holding apparatus comprising:
   a pneumatic cylinder;
   a plunger, movably disposed at a central position of the pneumatic cylinder, comprising a curved surface;
   an inlet pipe, connected to the pneumatic cylinder, the pneumatic cylinder and plunger arranged such that air pumped into the pneumatic cylinder through the inlet pipe impels the plunger in a first direction to contact the wafer and bring the curved surface into abutment with opposite sides of the notch, thereby distributing an impact force of the plunger along two different directions, wherein the first direction and the curved surface are in line with a radius of the wafer; and
   a relief valve, connected to the inlet pipe, wherein a portion of the air in the inlet pipe is discharged through the relief valve to regulate air pressure to the pneumatic cylinder.

2. The holding apparatus as claimed in claim 1, further comprising an exhaust pipe connected to the pneumatic cylinder, wherein the plunger separates from the semiconductor wafer when the air is discharged from the pneumatic cylinder through the exhaust pipe.

3. The holding apparatus as claimed in claim 1, further comprising a three-way joint and a discharge pipe with the relief valve disposed thereon, wherein the three-way joint connects the inlet pipe and the discharge pipe.

4. The holding apparatus as claimed in claim 1, further comprising a tray sustaining the semiconductor wafer.

5. The holding apparatus as claimed in claim 4, the tray comprising two stop portions disposed at the edge thereof, wherein the semiconductor wafer is held and restricted in a predetermined position by the stop portions and the plunger.

6. The holding apparatus as claimed in claim 5, wherein each of the stop portions comprises a curved flange contacting the semiconductor wafer.

7. The holding apparatus as claimed in claim 1, further comprising a base and a first arm movable with respect to the base, wherein the pneumatic cylinder is disposed in the first arm.

8. The holding apparatus as claimed in claim 7, further comprising a second arm and a third arm, wherein the third arm is movably connected to the base, and the second arm movably connects the first and third arms.

9. A robotic manipulator for handling a semiconductor wafer, wherein the semiconductor wafer has a notch, the holding apparatus comprising:
   a base;
   a first arm, movable with respect to the base;
   a pneumatic cylinder, disposed in the first arm;
   a plunger, movably disposed at a central position of the pneumatic cylinder, comprising a curved surface;
   an inlet pipe, connected to the pneumatic cylinder, the pneumatic cylinder and plunger arranged such that air pumped into the pneumatic cylinder through the inlet pipe impels the plunger in a first direction to contact the wafer and bring the curved surface into abutment with opposite sides of the notch, thereby distributing an impact force of the plunger along two different directions, wherein the first direction and the curved surface are in line with a radius of the wafer; and
   a relief valve, connected to the inlet pipe, wherein a portion of the air in the inlet pipe is discharged through the relief valve to regulate air pressure to the pneumatic cylinder.

10. The robotic manipulator as claimed in claim 9, further comprising an exhaust pipe connected to the pneumatic cylinder, wherein the plunger separates from the semiconductor wafer when the air is discharged from the pneumatic cylinder through the exhaust pipe.

11. The robotic manipulator as claimed in claim 9, further comprising a three-way joint and a discharge pipe with the relief valve disposed thereon, wherein the three-way joint connects the inlet pipe and the discharge pipe.

12. The robotic manipulator as claimed in claim 9, further comprising a tray sustaining the semiconductor wafer.

13. The robotic manipulator as claimed in claim 12, the tray comprising two stop portions disposed at the edge thereof, wherein the semiconductor wafer is held and restricted in a predetermined position by the stop portions and the plunger.

14. The robotic manipulator as claimed in claim 13, wherein each of the stop portions comprises a curved flange contacting the semiconductor wafer.

15. The robotic manipulator as claimed in claim 9, further comprising a second arm and a third arm, wherein the third arm is movably connected to the base, and the second arm movably connects the first and third arms.

\* \* \* \* \*